(12) United States Patent
Tajalli

(10) Patent No.: US 9,000,845 B2
(45) Date of Patent: Apr. 7, 2015

(54) AUTOMATIC GAIN CONTROL ELECTRONIC CIRCUIT WITH DUAL SLOPE FOR AN AMPLIFIER

(71) Applicant: EM Microelectronic-Marin S.A., Marin (CH)

(72) Inventor: Armin Tajalli, Chavannes-pres-Renens (CH)

(73) Assignee: EM Microelectronic-Marin S.A., Marin (CH)

( * ) Notice: Subject to any disclaimer, the term of this patent is extended or adjusted under 35 U.S.C. 154(b) by 0 days.

(21) Appl. No.: 14/058,650

(22) Filed: Oct. 21, 2013

(65) Prior Publication Data

US 2014/0118067 A1 May 1, 2014

(30) Foreign Application Priority Data

Oct. 26, 2012 (EP) .................................... 12190219

(51) Int. Cl.
*H03G 3/10* (2006.01)
*H03G 3/30* (2006.01)
*H03F 3/45* (2006.01)

(52) U.S. Cl.
CPC ............. *H03G 3/30* (2013.01); *H03F 3/45197* (2013.01); *H03G 3/3052* (2013.01)

(58) Field of Classification Search
USPC .................................. 330/278, 257, 261, 254
See application file for complete search history.

(56) References Cited

U.S. PATENT DOCUMENTS

| 4,870,372 | A | 9/1989 | Suter | |
| 6,717,474 | B2 * | 4/2004 | Chen et al. | 330/301 |
| 7,102,434 | B2 * | 9/2006 | Grillo | 330/254 |
| 7,230,486 | B2 * | 6/2007 | Mukherjee et al. | 330/257 |
| 7,825,727 | B2 * | 11/2010 | Shimatani | 330/253 |
| 8,207,789 | B2 * | 6/2012 | Tsuzaki | 330/253 |
| 2004/0009758 | A1 | 1/2004 | Graham et al. | |
| 2009/0072904 | A1 | 3/2009 | Bae et al. | |
| 2009/0117868 | A1 | 5/2009 | Exeter | |
| 2012/0235744 | A1 | 9/2012 | Albertini et al. | |

FOREIGN PATENT DOCUMENTS

EP   0 342 671 A2   11/1989

OTHER PUBLICATIONS

European Search Report issued Mar. 19, 2013, in European Patent Application No. 12190219, filed Oct. 26, 2012 (with English Translation).

* cited by examiner

*Primary Examiner* — Henry Choe
(74) *Attorney, Agent, or Firm* — Oblon, McClelland, Maier & Neustadt, L.L.P.

(57) ABSTRACT

The electronic circuit is arranged for the fast, automatic gain control of an input amplifier. It includes a non-linear amplifier-comparator for comparing a reference signal ($V_R$) to an amplitude signal ($V_P$) at the output of the input amplifier. The amplifier-comparator performs dual slope adaptation of the input amplifier gain according to a defined deviation threshold between the two input signals. The amplifier-comparator includes two branches each with three transistors connected in series between the terminals of a supply voltage source. First and second polarization transistors (M5, M6) are connected to the first and second input transistors (M1, M2) controlled by the first and second input signals, which are respectively connected to a first diode-connected transistor (M3) and a second transistor (M4) of a current mirror. A non-linear transconductance element ($R_{NL}$) connects the sources of the input transistors to define a dual slope gain adaptation of the non-linear amplifier-comparator.

11 Claims, 3 Drawing Sheets

AUTOMATIC GAIN CONTROL ELECTRONIC CIRCUIT WITH DUAL SLOPE FOR AN AMPLIFIER

This application claims priority from European Patent Application No. 12190219.1 filed Oct. 26, 2012, the entire disclosure of which is incorporated herein by reference.

FIELD OF THE INVENTION

The present invention concerns an electronic circuit for the automatic gain control of an amplifier. The gain of the input amplifier of the electronic circuit is adapted in an automatic gain control loop, in particular with dual slope adaptation to increase the gain adaptation speed and to maintain the stability of the electronic circuit.

BACKGROUND OF THE INVENTION

In a conventional manner, particularly for the reception of data or control signals, this type of electronic circuit 1 may comprise the electronic components shown in FIG. 1 for the automatic gain control of an input amplifier 2. This input amplifier 2 is connected directly or via a shaping stage to an antenna receiving data and/or control signals (not shown). Input amplifier 2 amplifies an input signal $V_{IN}$ in the automatic gain control loop with an adapted gain based on the signal or signals picked up by the antenna. The output signal $V_{OUT}$ which is an alternating signal dependent on the incoming signal carrier frequency, is supplied to a conventional peak detector 3. The peak detector 3 outputs a rectified signal $V_P$, which may be continuous and which represents the amplitude of input signal $V_{IN}$ amplified by input amplifier 2. This rectified signal $V_P$ may be stored in a capacitor $C_P$ of peak detector 3.

Electronic circuit 1 further includes an amplifier-comparator 4, which determines an error between the rectified signal $V_P$ representative of the amplitude of signals $V_{OUT}$ amplified by input amplifier 2, and a reference signal $V_R$. The rectified signal and the reference signal are generally a rectified voltage $V_P$ and a reference voltage $V_R$ supplied to the input of amplifier-comparator 4. Rectified voltage $V_P$ is supplied to the negative input, whereas reference voltage $V_R$ is supplied to the positive input of amplifier-comparator 4. According to the error determined between the two compared voltages, an adaptation signal in the form of an adaptation current or voltage $V_{AGC}$ is delivered by amplifier-comparator 4 to the input amplifier to adapt the gain of said input amplifier 2. An integration capacitor $C_{INT}$ is also arranged at the output of amplifier-comparator 4, if the amplifier-comparator output signal is in the form of a current. This amplifier-comparator 4 may be defined as a transconductance unit or an OTA operational transconductance amplifier. The gain of input amplifier 2 is adapted to a stable operating value, until the difference between the rectified voltage $V_P$ and the reference voltage $V_R$ becomes close to zero.

Although not shown in FIG. 1, the output of input amplifier 2 of the electronic circuit can be connected to a mixer unit. The mixer unit can convert the frequency of the signals picked up by the antenna and amplified by the input amplifier by means of at least one oscillating signal from a local oscillator. The intermediate signal or signals outputted by the mixer unit may thus be converted to a low frequency and even directly into base band before a data or control signal demodulation operation in a demodulator. In order to be able to demodulate the data properly, the amplitude of the signals amplified by the input amplifier must be adapted in the automatic gain control loop.

If there is a significant difference between the expected incoming signal amplitude and reference signal amplitude, fast adaptation of the input amplifier gain is required, in order for all the data demodulation operations to be performed. The setting time of the automatic gain control loop must therefore be decreased to rapidly achieve a stable operating point of the electronic circuit.

US Patent Application No. 2009/0117868 A1, which discloses an electronic circuit for the automatic gain control of a radio receiver with fast setting of gain adaptation, can be cited in this regard. The electronic circuit includes an input amplifier, whose gain can be adapted. This input amplifier receives signals picked up by an antenna and filtered and shaped by a shaping stage. The amplifier output signal is connected to a demodulator to determine the data of the signals picked up by the antenna. The demodulator output signal, which may be an output voltage, is compared to a first reference level in a first comparator and to a second reference level in a second comparator. The second reference level is defined to be greater than the first reference level. The output of each comparator is connected to a gain control terminal of the input amplifier.

The first comparator delivers a first comparison current, which is smaller than the second comparison current of the second comparator. If the demodulator output voltage is between the first threshold level and the second threshold level, a low amplifier gain setting is performed. However, if the demodulator output voltage is above the second threshold level, the two currents of the two comparators are added together to perform a fast gain setting of the input amplifier. Thus, dual slope adaptation is performed in the automatic gain control loop. However, the design of this type of electronic circuit is relatively complicated to reduce the setting time of the automatic gain control loop, which is a drawback. Moreover, fast gain adaptation cannot easily be taken into account when the demodulator output voltage is below the first threshold level, which is another drawback.

US Patent Application No 2004/0009758 A1, which discloses a fast response automatic gain control electronic circuit for narrow band systems, may be also be cited. The electronic circuit includes, in particular, an input amplifier, whose gain can be adapted in an automatic gain control loop. The input amplifier amplifies an input signal from signals picked up by an antenna to deliver an amplified signal to a mixer for low frequency conversion. The mixer outputs base band signals formed of an in-phase baseband signal I and a quadrature baseband signal Q. An AGC loop detector sets a level of the sum of the squares of the in-phase and quadrature signals to deliver an output signal to an integration capacitor. This integration capacitor is connected via a drive device to a gain control terminal of the input amplifier.

When the AGC control loop is in a closed state, parabolic adaptation occurs to adapt the input amplifier gain, which reduces the setting time of the automatic gain control loop, if the detected level is high relative to the desired incoming signal level. However, to perform this adaptation in the automatic gain control loop, many relatively complicated electronic components must be used, which is a drawback. Further, this does not facilitate the electronic testing of the electronic circuit, which is another drawback.

SUMMARY OF THE INVENTION

It is therefore an object of the invention to overcome the drawbacks of the aforementioned state of the art by providing an electronic circuit for the automatic gain control of at least one input amplifier, which is compact, easy to implement and can rapidly adapt the amplifier gain via dual slope adaptation.

The invention therefore concerns an electronic circuit for the automatic gain control of an input amplifier, the electronic circuit including a non-linear amplifier-comparator in an automatic gain control loop, for comparing a first reference signal to a second signal relating to the amplitude level of an output signal of the input amplifier, the non-linear amplifier-comparator allowing the dynamic, analogue, dual slope adaptation of the input amplifier gain, wherein the non-linear amplifier-comparator includes a first branch with a first input transistor having a first type of conductivity, arranged in series between a first polarisation transistor having a first type of conductivity and a first diode-connected transistor having a second type of conductivity of a current mirror, between a negative terminal and a positive terminal of a supply voltage source, a gate or a base of the first input transistor being capable of receiving the first signal or the second signal, wherein the non-linear amplifier-comparator includes a second branch with a second input transistor having a first type of conductivity, arranged in series between a second polarisation transistor having a first type of conductivity and a second transistor having a second type of conductivity of the current mirror, between the negative terminal and the positive terminal of the supply voltage source, a gate or a base of the second polarisation transistor being connected to a gate or a base of the first polarisation transistor to be powered by a polarisation voltage, a gate or a base of the second transistor of the current mirror being connected to a gate or a base of the first diode-connected transistor of the current mirror, and a gate or a base of the second input transistor being capable of receiving the second reference signal or the first signal inversely to the first input transistor, and wherein the non-linear amplifier-comparator includes at least one non-linear transconductance element connecting the source or the emitter of the first input transistor to the source or the emitter of the second input transistor and capable of allowing the amplifier-comparator to output via the drain or the collector of the second input transistor, a dual slope gain adjustment signal, if the deviation between the first input signal and the second input signal is greater or smaller than a defined threshold.

Specific embodiments of the electronic circuit for the automatic gain control of at least one input amplifier are defined in the dependent claims 2 to 11.

One advantage of the electronic circuit for the automatic gain control of at least one input amplifier lies in the fact that it is very compact and provides dual slope analogue adaptation of the input amplifier gain, which gives a very fast setting time. During any transition of the input signal level, there is a dynamic, analogue increase of the gain in the automatic gain control loop to accelerate the adaptation attack time. However, the loop gain decreases towards a stable operation gain of the electronic circuit.

To perform this dual slope adaptation in the loop, at least one non-linear, analogue transconductance element is used in a non-linear amplifier-comparator. This non-linear transconductance element has a low transconductance value when the deviation of the non-linear amplifier-comparator input signals is below a determined threshold. However, this non-linear transconductance element has a high transconductance value when the non-linear amplifier-comparator input signal deviation is above a determined threshold, which defines the fast, stable, dual slope adaptation.

Advantageously, using a non-linear amplifier-comparator for the dual slope adaptation of the input amplifier gain reduces the attack time for fast gain setting in the automatic gain control loop. As a result, it is also possible to perform a fast electronic test of this type of electronic circuit at the end of the integrated circuit manufacturing method, even if the data rate in the incoming signals to be processed in the electronic circuit is low.

BRIEF DESCRIPTION OF THE DRAWINGS

The objects, advantages and features of the electronic circuit for the automatic gain control of at least one input amplifier will appear more clearly in the following description, based on non-limiting embodiments illustrated by the drawings, in which.

DETAILED DESCRIPTION OF THE INVENTION

Figure 1:
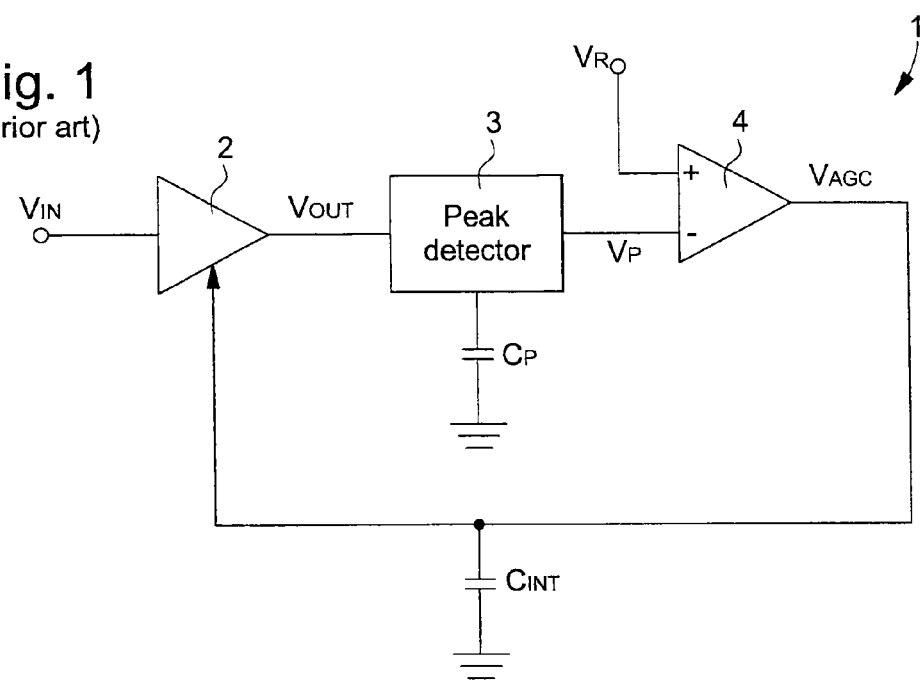
FIG. 1, cited above, shows a simplified view of the electronic components of the automatic gain control electronic circuit for an amplifier.

In the following description, all those electronic components of the automatic gain control electronic circuit for an input amplifier, which are well known to those skilled in the art in this technical field, will only be described in a simplified manner. The electronic circuit may include similar components to those described with reference to the aforecited FIG. 1, but with a non-linear amplifier-comparator 4 capable of dual slope analogue gain adaptation of input amplifier 2 as a function of an error signal. This LNA or VGA input amplifier may be capable of amplifying FSK or PSK radio frequency signals picked up by an antenna, or other types of narrow band signals. It may also be an input amplifier arranged after a signal mixer to amplify frequency-converted intermediate signals.

Figure 2:
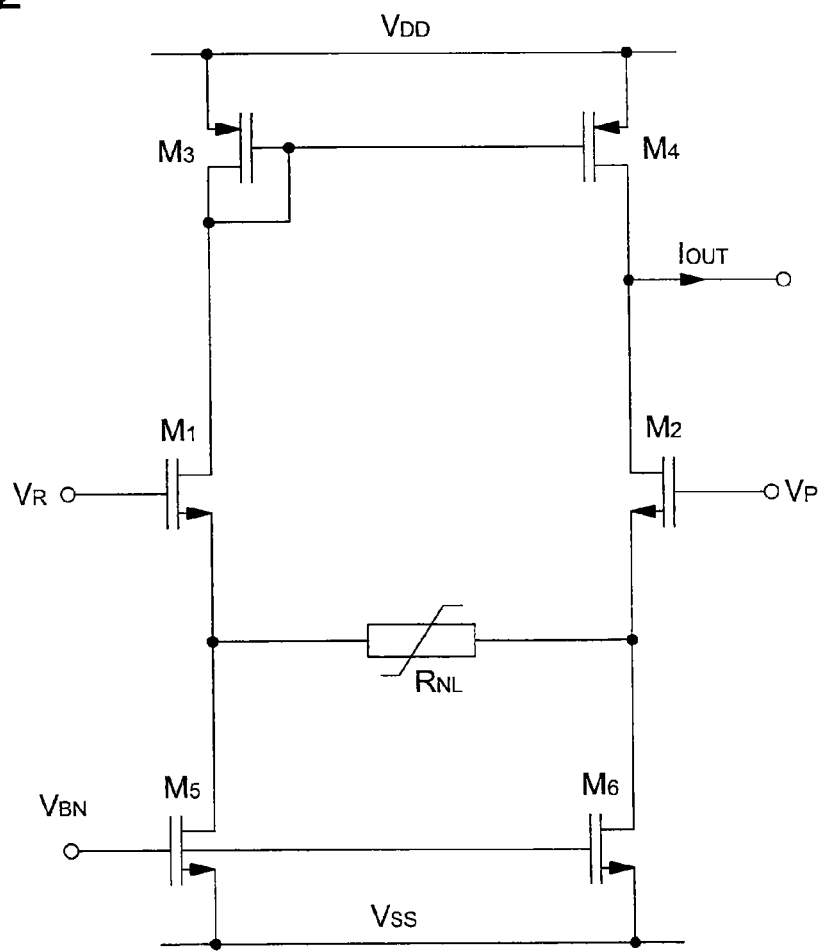
FIG. 2 shows a simplified view of the non-linear amplifier-comparator for an error signal of the automatic gain control electronic circuit for the input amplifier according to the invention.

FIG. 2 thus very generally shows a non-linear amplifier-comparator of the electronic circuit for the dual slope automatic gain control of an input amplifier. The non-linear amplifier-comparator is formed of two branches with a series arrangement of transistors between a positive terminal $V_{DD}$ and a negative terminal $V_{SS}$ of a supply voltage source (not shown). The supply voltage of the electronic circuit may preferably be set between 1.2 V and 3.6 V and naturally depends on the semiconductor technology used, which may be bipolar technology or CMOS technology for example. Depending on the technology used, the supply voltage may have a value of around 0.8 V.

In a first branch, the non-linear amplifier-comparator includes a first input transistor M1 having a first type of conductivity. The gate or base of this first input transistor M1 defines a positive input for receiving a first positive input signal $V_R$, which is a specific reference voltage. This reference voltage $V_R$ may be programmed according to the expected output signal amplitude level of the input amplifier.

The source or emitter of the first input transistor M1 is connected to the drain or collector of a first polarisation transistor M5 having a first type of conductivity, while the drain or the collector of the first input transistor M1 is connected to a first diode-connected transistor M3 having a second type of conductivity of a current mirror. The source or emitter of the first polarisation transistor M5 is directly connected to a first terminal of the supply voltage source, while the source or emitter of the first transistor M3 of the current mirror is connected to a second terminal of the supply voltage source. The gate or base of the first polarisation transistor M5 is controlled by a polarisation voltage $V_B$ so that said first polarisation transistor M5 acts as a first current source in the first branch.

In a second branch, the non-linear amplifier-comparator includes a second input transistor M2 having a first type of conductivity. The gate or base of this second input transistor M2 defines a negative input for receiving a second negative input signal $V_P$, which depends on the output voltage level of the input amplifier of the electronic circuit. This voltage level may be outputted by a peak detector, which detects the maximum voltage of the alternating output signal of the input amplifier. This maximum voltage is a peak voltage. The voltage level may be stored in a capacitor of the peak detector.

The source or emitter of the second input transistor M2 is connected to the drain or to the collector of a second polarisation transistor M6 having a first type of conductivity, while the drain or collector of the second input transistor M2 is connected to the drain or to the collector of a second transistor M4 having a second type of conductivity of the mirror current. The source or emitter of the second polarisation transistor M6 is directly connected to a first terminal of the supply voltage source, while the source or emitter of the second transistor M4 of the current mirror is connected to a second terminal of the supply voltage source. The connection of the drain or collector of the second input transistor M2 to the drain or collector of the second transistor M4 of the current mirror defines the output of the non-linear amplifier-comparator. Generally, the output signal may be a dual slope gain adaptation current $I_{OUT}$ or voltage of the input amplifier.

The gate or base of the second transistor M4 of the current mirror is connected to the gate or base of the first diode-connected transistor M3 of the current mirror so as to mirror the current passing into the first transistor M3 in the second transistor M4. Preferably, the first and second transistors M3 and M4 of the current mirror are of the same dimensions, so that the current in the first transistor M3 is the same as the current mirrored in the second transistor M4 in normal, stable operation.

The gate or base of the second polarisation transistor M6 is directly connected to the gate or base of the first polarisation transistor M5, to be controlled by polarisation voltage $V_B$. This polarisation voltage $V_B$ is defined so that the second polarisation transistor M6 acts as a second current source in the second branch. Preferably, polarisation transistors M5 and M6 are of equal dimensions so that the current of the first current source is equal to the current of the second current source.

In order for the non-linear amplifier-comparator to output an output signal for the dual slope analogue and dynamic adaptation of the input amplifier gain, it also includes at least one impedance element with non-linear transconductance $R_{NL}$. This non-linear transconductance unit or element connects the two branches of the non-linear amplifier-comparator. Generally, this non-linear transconductance element $R_{NL}$ connects the source or emitter of the first input transistor M1 to the source or emitter of the second input transistor M2. It should also be noted that this non-linear transconductance element is defined to include one or several transistors, which may be combined with one or more resistors.

For small voltage deviations between the positive input voltage $V_R$ and the negative input voltage $V_P$, this element has low transconductance, which means a high resistivity value in order to have only a very low effect in connection with the two branches. Output current $I_{OUT}$ thus only varies on a gentle slope. However, for a significant voltage deviation beyond a defined threshold, the transconductance of the element becomes quite high, which means a low resistivity value with a portion of the current of one of the branches passing through the non-linear transconductance element. The output current $I_{OUT}$ in this case varies on a steeper slope so as to define the dual slope adaptation. For example, if the negative input voltage $V_P$ differs by more than 5 or 10% from the specific reference voltage $V_R$, the defined threshold is exceeded and a high transconductance is set for the non-linear transconductance element for fast adaptation of the input amplifier gain.

Figure 6:
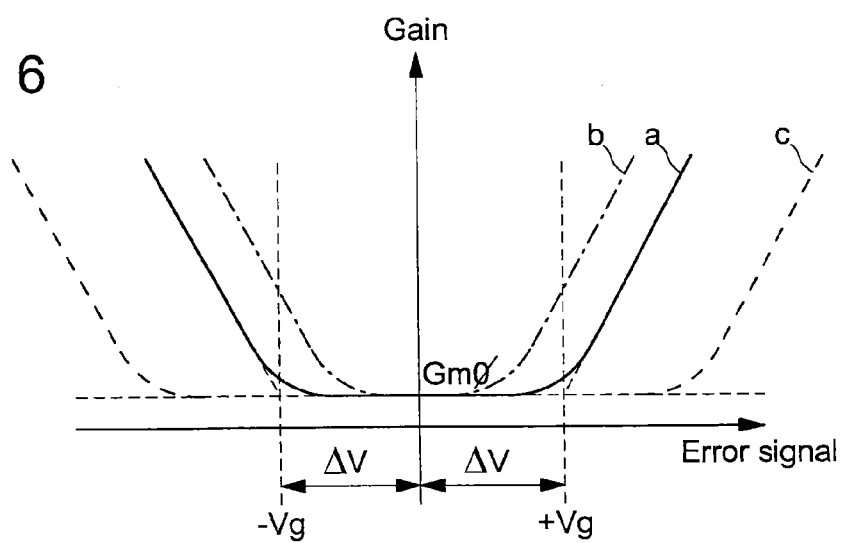
FIG. 6 shows a gain adaptation graph for the input amplifier based on the error signal of the non-linear amplifier-comparator of the automatic gain control electronic circuit of the input amplifier according to the invention.

FIG. 6 shows a graph of the input amplifier gain to be adapted relative to the error signal, which corresponds to the deviation between negative input voltage $V_P$ and specific reference voltage $V_R$. In an area of low absolute deviation value $\Delta V$ between negative input voltage $V_P$ and specific reference voltage $V_R$, the gain of the AGC loop is slowly diminished or increased to achieve stable operation around the expected value $G_{m0}$. However, beyond the defined threshold, a very high or very low gain is imposed on the input amplifier for a fast return to a gain adapted to the expected input amplifier value.

As shown in FIG. 2, the first and second input transistors M1 and M2 may preferably be NMOS transistors, just like the first and second polarisation transistors M5 and M6 connected to negative terminal $V_{SS}$ of the supply voltage source. However, the first and second transistors M3 and M4 of the current mirror may be PMOS transistors connected to the positive terminal $V_{DD}$ of the supply voltage source. For proper operation of the non-linear amplifier-comparator, each input signal $V_P$ and $V_R$ of the non-linear amplifier-comparator may be at a level located between the threshold voltage of the NMOS transistor which it controls, and the high potential $V_{DD}$ of the supply voltage source.

It should be noted that instead of the arrangement shown in FIG. 2, it is possible to envisage using PMOS transistors for transistors M1, M2, M5 and M6, and NMOS transistors for transistors M3 and M4 in a reverse configuration. Transistors M5 and M6 are thus connected to the positive terminal $V_{DD}$, while transistors M3 and M4 are connected to the negative terminal $V_{SS}$. Likewise, a design with bipolar transistors may be envisaged, by replacing all the PMOS transistors with PNP transistors and all the NMOS transistors with NPN transistors. A combination of bipolar transistors and MOS transistors may also be envisaged for the non-linear amplifier-comparator, for example by having NPN or PNP transistors for transistors M1 and M2 and MOS transistors for the other transistors M3 to M6.

Figure 3:
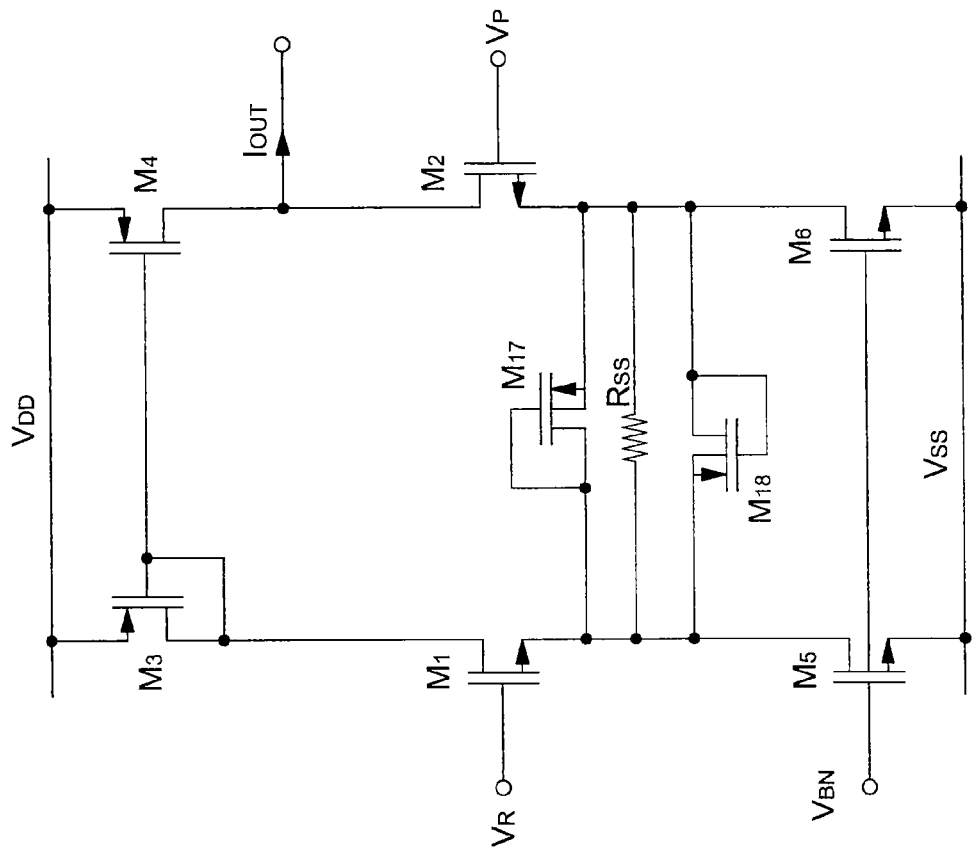
FIG. 3 shows a first detailed embodiment of the non-linear amplifier-comparator for an error signal of the automatic gain control electronic circuit for the input amplifier according to the invention.

A first embodiment of the non-linear transconductance element of the non-linear amplifier-comparator is shown in FIG. 3. It should be noted that those elements in FIG. 3 that are the same as those in FIG. 2 described above bear identical reference signs. Consequently, for the sake of simplification, the description of all these elements will not be repeated.

The non-linear transconductance element is formed of two pairs of transistors having a first type of conductivity M7, M8, M9 and M10 series-connected between the source or emitter of the first input transistor M1 and the source or emitter of the second input transistor M2. The sources or emitters of the two transistors M7 and M8 of the first pair are connected to the source or emitter of the first input transistor M1. The drains or collectors of the two transistors M7 and M8 of the first pair are connected to the sources or emitters of the two transistors M9 and M10 of the second pair. The drains or collectors of the two transistors M9 and M10 of the second pair are connected to the source or emitter of the second input transistor M2.

The gates or bases of a first transistor M7 of the first pair and of a first transistor M9 of the second pair are connected to the gate or the base of the first input transistor M1. The gates or bases of a second transistor M8 of the first pair and of a second transistor M10 of the second pair are connected to the gate or the base of the second input transistor M2.

Preferably and as shown in FIG. 3, the transistors of the first and second pairs of transistors of the non-linear transconductance element are NMOS transistors. These NMOS transistors M7 to M10 of the transistor pairs are connected to the NMOS input transistors M1 and M2. Of course, as explained with reference to FIG. 2, the transistors of the non-linear amplifier-comparator may be of a different type from those shown in FIG. 3. It is possible to envisage forming the two pairs of transistors with PMOS transistors, or even with PNP or NPN bipolar transistors. As explained above, the resistivity of the transistor pairs is very high when the deviation between negative rectified voltage $V_P$ and reference voltage $V_R$ is low, below a defined threshold. However, the resistivity of these transistor pairs becomes low when the deviation between rectified negative voltage $V_P$ and reference voltage $V_R$ is above the defined threshold.

The embodiment shown in FIG. 3 is based on a source degeneration architecture, which is well known. The dimension of NMOS transistors M7 to M10 may be selected such that the resistivity revealed is much higher than the transconductance of input transistors M1 and M2. As a result of this property, the transfer feature is similar to that required for a non-linear automatic gain control loop as shown in FIG. 6. To be able to adjust the transconductance, it is possible either to increase the number of transistors in the transistor pairs or to increase the length thereof. Depending on the technology used, account must be taken of the improvement in linearity performance, which means that the resistivity of transistors M7 to M10 needs to be chosen very carefully and quite close to the transconductance of input transistors M1 and M2.

By way of non-limiting example, for a transconductance Gm of input transistors M1 and M2, the total equivalent resistivity of the non-linear transconductance element must be greater than 1/Gm. Thus input transistors M1 and M2 may be made with a gate length equal to 0.35 μm and a gate width equal to 10 μm, while for each transistor of the transistor pairs M7 to M10, the gate length may be equal to 0.35 μm and the gate width may be equal to 1 μm.

Figure 4:
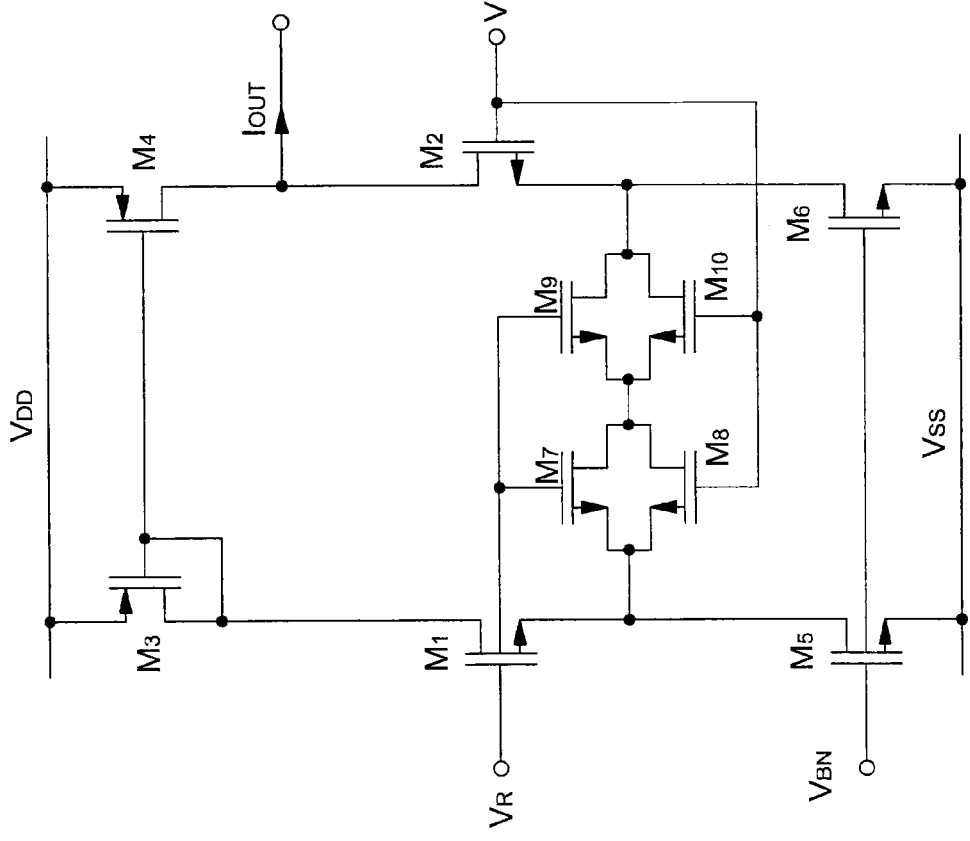
FIG. 4 shows a second detailed embodiment of the non-linear amplifier-comparator for an error signal of the automatic gain control electronic circuit for the input amplifier according to the invention.

A second embodiment of the non-linear transconductance element of the non-linear amplifier-comparator is shown in FIG. 4. It should be noted that those elements in FIG. 4 which are the same as those in FIGS. 2 and 3 bear identical reference signs. Consequently, for the sake of simplification, the description of all these elements will not be repeated.

The non-linear transconductance element is formed of two diode-connected transistors M17 and M18 having a second type of conductivity and a resistance $R_{SS}$ all connected in parallel and connected to the sources or emitters of input transistors M1 and M2. The source or emitter of the first diode-connected transistor M17 is connected to the source or emitter of the second input transistor M2, while the gate or the base and the drain or the collector of the first diode-connected transistor M17 are connected to the source or emitter of the first input transistor M1. The source or emitter of the second diode-connected transistor M18 is connected to the source or emitter of the first input transistor M1, while the gate or the base and the drain or the collector of the second diode-connected transistor M18 are connected to the source or the emitter of the second input transistor M2. The first diode-connected transistor M17 is inversely connected to the second diode-connected transistor M18.

By way of non-limiting example, resistor $R_{SS}$ may have a resistive value equal to 1 MOhms or 10 MOhms or higher, and the two diode-connected transistors M17 and M18, which are preferably PMOS transistors, as shown in FIG. 4, may be dimensioned like the NMOS transistors of transistor pairs M7 to M10 shown in FIG. 3. The resistive value of resistor $R_{SS}$ is selected to be much higher than the equivalent source resistance of input transistors M1 and M2. Owing to this high resistive value $R_{SS}$, it is possible to define the low gain area of the non-linear amplifier-comparator in FIG. 6 around the expected gain $G_{m0}$ of the input amplifier.

When the difference between the negative input voltage $V_P$ and the positive input voltage $V_R$ is greater than a determined deviation, which is a defined error threshold, the diode-connected transistors M17 and M18 will be operational and will reduce the equivalent resistivity of the sources or emitters of input transistors M1 and M2. However, when negative input voltage $V_P$ is close to positive input voltage $V_R$, the diode-connected transistors M17 and M18 are non-conductive, and transconductance $G_m$ is equal to $1/R_{SS}$. It is therefore possible to achieve non-linear transconductance as required and shown in the graph in FIG. 6, while maintaining high stability, when the input voltages are relatively close to each other.

Figure 5:
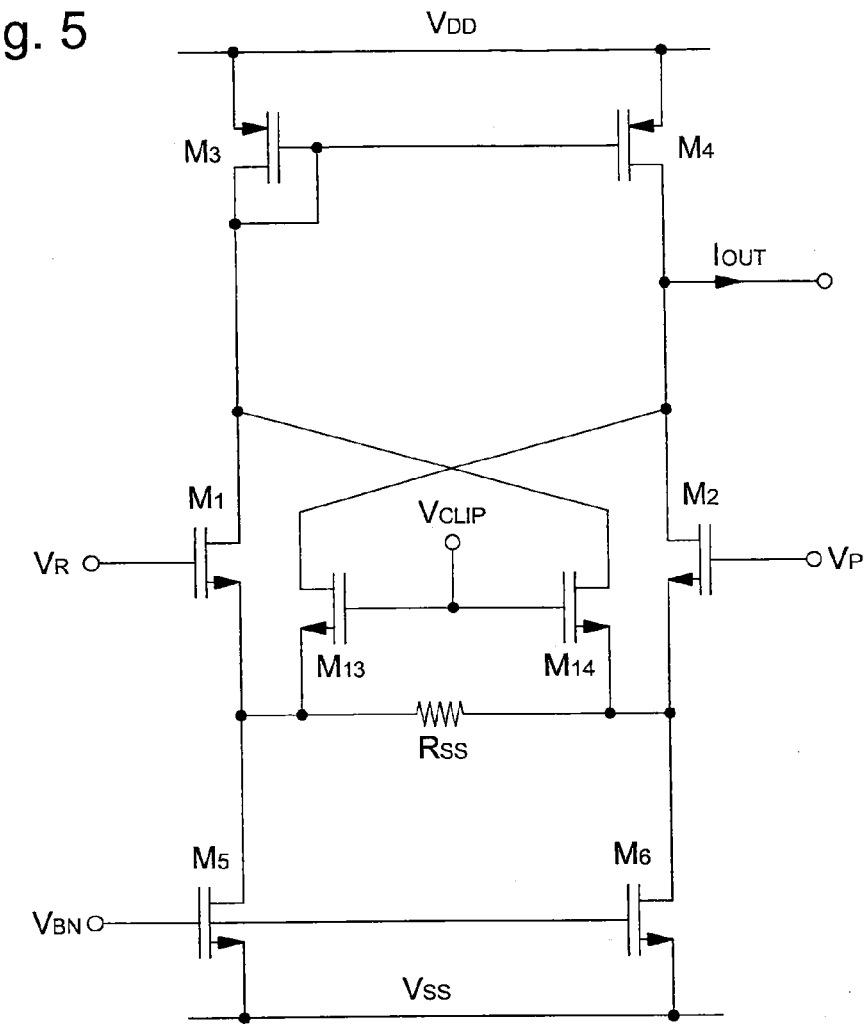
FIG. 5 shows a third detailed embodiment of the non-linear amplifier-comparator for an error signal of the automatic gain control electronic circuit for the input amplifier according to the invention.

A third embodiment of the non-linear transconductance element of the non-linear amplifier-comparator is shown in FIG. 5. It should be noted that those elements in FIG. 5 that are the same as those in FIGS. 2 to 4 bear identical reference signs. Consequently, for the sake of simplification, the description of all these elements will not be repeated.

The non-linear transconductance element is formed of a resistor $R_{SS}$ connected to the sources or emitters of input transistors M1 and M2, of a first adaptation transistor M13 having a first type of conductivity and of a second adaptation transistor M14 having a first type of conductivity. The source or emitter of the first transistor M13 is connected to the source or emitter of the first input transistor M1, while the drain or the collector of the first transistor M13 is connected to the drain or the collector of the second input transistor M2. The source or emitter of the second transistor M14 is connected to the source or emitter of the second input transistor M2, while the drain or the collector of the second transistor M14 is connected to the drain or the collector of the first input transistor M1.

The gates or bases of the first and second transistors M13 and M14 of the non-linear transconductance element are connected to each other in order to receive a transconductance threshold adaptation voltage $V_{CLIP}$ for the non-linear transconductance element. The allowable error between the two input voltages to be within a slow adaptation area around the expected value of the input amplifier gain may be defined according to the value of voltage $V_{CLIP}$ applied across the gates or bases of the first and second transistors M13 and M14. Evidently, the value of this voltage $V_{CLIP}$ is also dependent on the technology used and the operating temperature.

As shown in FIG. 5, the first and second transistors M13 and M14 of the non-linear transconductance element are preferably NMOS transistors, just like input transistors M1 and M2 and polarisation transistors M5 and M6 connected to the negative terminal $V_{SS}$ of the supply voltage source. However, the current mirror transistors M3 and M4 are PMOS transistors connected to the positive terminal $V_{DD}$ of the supply voltage source. As for the second embodiment of FIG. 4, resistance $R_{SS}$ may be defined with a high resistive value, for example 1 MOhms or 10 MOhms or higher. This resistance $R_{SS}$ may define the expected transconductance $1/G_{m0}$. This defines a low gain area when the difference between input voltages $V_P$ and $V_R$ is relatively low. However, when the difference between the input voltages is greater than $+V_{CLIP}$ or lower than $-V_{CLIP}$, the first and second transistors M13 and M14 are operational. In these conditions, the current passes exclusively through one or other of the first and second transistors M13 and M14 depending upon whether the difference between the input voltages is positive or negative. The transconductance will thus greatly increase to define the two slopes shown in FIG. 6.

FIG. 6 therefore shows an adaptation gain graph for the input amplifier based on the error signal of the non-linear amplifier-comparator of the electronic circuit. This gain adaptation graph is similar for a NMOS or PMOS configuration of the non-linear amplifier-comparator. The automatic gain adaptation has at least two slopes.

If the absolute value deviation $\Delta V$ between the input voltages is beyond a defined threshold in an error area between $-Vg$ and $+Vg$, a very high gain or very low gain is applied to the input amplifier by the non-linear amplifier-comparator for a fast return to the expected input amplifier gain value. If the negative input voltage is lower than the positive input voltage in the non-linear amplifier-comparator, this means that the gain is insufficient. In these conditions, the non-linear amplifier-comparator forces a higher gain in the input amplifier. However, if the voltage at the positive input is lower than the voltage at the negative input in the non-linear amplifier-comparator, the gain is too high. In these conditions, the non-linear amplifier-comparator reduces the gain in the input amplifier.

Three gain curves a, b and c are shown in FIG. 6, which depend on the value of the voltage $V_{CLIP}$ applied across the first and second transistors M13 and M14 of FIG. 5. The lower the voltage $V_{CLIP}$ is, the more the steep gain adaptation slope occurs at a low input voltage deviation as shown by curve b. The higher the voltage $V_{CLIP}$ is and the more the steep adaptation slope occurs to a large input voltage deviation as shown by curve c. This voltage $V_{CLIP}$ may be changed during operation of the electronic circuit to adapt error area voltages $-Vg$ and $+Vg$ or also the noise margin.

From the description that has just been given, those skilled in the art can devise several variants of the automatic gain control electronic circuit for an input amplifier without departing from the scope of the invention defined by the claims. The first reference signal may also be delivered to the gate or base of the second input transistor of the amplifier-comparator, while the second signal dependent on the level of the input amplifier output signal may be delivered to the first input transistor. In these conditions, it may also be mounted an inverter to the amplifier-comparator output or control the gain increase, if the first signal is higher than the second signal. It is possible to envisage connecting resistors in series in each branch of the non-linear amplifier-comparator, to linearising the current mirror transistors or the polarisation transistors.

What is claimed is:

1. An electronic circuit for the automatic gain control of an input amplifier, the electronic circuit including a non-linear amplifier-comparator in an automatic gain control loop, for comparing a first reference signal to a second signal relating to the amplitude level of an output signal of the input amplifier, the non-linear amplifier-comparator allowing the dynamic, analogue, dual slope adaptation of the input amplifier gain, wherein the non-linear amplifier-comparator includes a first branch with a first input transistor having a first type of conductivity, arranged in series between a first polarisation transistor having a first type of conductivity and a first diode-connected transistor having a second type of conductivity of a current mirror, between a negative terminal and a positive terminal of a supply voltage source, a gate or a base of the first input transistor being capable of receiving the first signal or the second signal, wherein the non-linear amplifier-comparator includes a second branch with a second input transistor having a first type of conductivity, arranged in series between a second polarisation transistor having a first type of conductivity and a second transistor having a second type of conductivity of the current mirror, between the negative terminal and the positive terminal of the supply voltage source, a gate or a base of the second polarisation transistor being connected to a gate or a base of the first polarisation transistor to be powered by a polarisation voltage, a gate or a base of the second transistor of the current mirror being connected to a gate or a base of the first diode-connected transistor of the current mirror, and a gate or a base of the second input transistor being capable of receiving the second reference signal or the first signal inversely to the first input transistor, and in that the non-linear amplifier-comparator includes at least one non-linear transconductance element connecting the source or the emitter of the first input transistor to the source or the emitter of the second input transistor and capable of allowing the amplifier-comparator to output via the drain or the collector of the second input transistor, a dual slope gain adjustment signal, if the deviation between the first input signal and the second input signal is greater or smaller than a defined threshold.

2. The electronic circuit according to claim 1, wherein the first and second input transistors are NMOS transistors, in that the first and second polarisation transistors are NMOS transistors and in that the first and second current mirror transistors are PMOS transistors.

3. The electronic circuit according to claim 2, wherein the source of the first and second polarisation transistors is directly connected to the negative terminal of the supply voltage source, and in that the source of the first and second transistors of the current mirror is directly connected to the positive terminal of the supply voltage source.

4. The electronic circuit according to claim 1, wherein the first and second input transistors are PMOS transistors, in that the first and second polarisation transistors are PMOS transistors and in that the first and second current mirror transistors are NMOS transistors.

5. The electronic circuit according to claim 4, wherein the source of the first and second polarisation transistors is directly connected to the positive terminal of the supply voltage source, and in that the source of the first and second transistors of the current mirror is directly connected to the negative terminal of the supply voltage source.

6. The electronic circuit according to claim 1, wherein the non-linear transconductance element is formed of two pairs of transistors having the same type of conductivity, series-connected between the source or emitter of the first input transistor and the source or emitter of the second input transistor.

7. The electronic circuit according to claim 6, wherein the two transistor pairs are formed of NMOS transistors, in that the sources of the two transistors of the first pair of transistors are connected to the source or emitter of the first input transistor, in that the drains of the two transistors of the first pair of transistors are connected to the sources of the two transistors of the second pair of transistors, in that the drains of the two transistors of the second pair of transistors are connected to the source or emitter of the second input transistor, in that the gates of a first transistor of the first pair of transistors and of a first transistor of the second pair of transistors are connected to the gate or the base of the first input transistor, and in that the gates of a second transistor of the first pair of transistors and of a second transistor of the second pair of transistors are connected to the gate or base of the second input transistor.

8. The electronic circuit according to claim 1, wherein the non-linear transconductance element is formed of a first diode-connected transistor, of a second diode-connected transistor inversely to the first diode-connected transistor, and of a resistor, which are all connected in parallel and connected to the sources or emitters of the first and second input transistors.

9. The electronic circuit according to claim 8, wherein the first and second diode-connected transistors are PMOS transistors, in that the source of the first diode-connected transistor is connected to the source or emitter of the second input transistor, in that the gate and the drain of the first diode-connected transistor are connected to the source or emitter of the first input transistor, in that the source of the second diode-connected transistor is connected to the source or emitter of the first input transistor, and in that the gate and the drain of the second diode-connected transistor are connected to the source or the emitter of the second input transistor.

10. The electronic circuit according to claim 1, wherein the non-linear transconductance element is formed of a resistor connected to the sources or emitters of the first and second input transistors, of a first adaptation transistor having a first type of conductivity and of a second adaptation transistor having a first type of conductivity, in that the source or the emitter of the first adaptation transistor is connected to the source or emitter of the first input transistor, in that the drain or collector of the first adaptation transistor is connected to the drain or to the collector of the second input transistor, in that the source or the emitter of the second adaptation transistor is connected to the source or the emitter of the second input transistor, in that the drain or the collector of the second adaptation transistor is connected to the drain or to the collector of the first input transistor, and in that the gates or the bases of the first and second adaptation transistors are connected to each other to receive an adaptation voltage in order to adapt the dual slope gain adaptation threshold of the non-linear amplifier-comparator.

11. The electronic circuit according to claim 1, wherein the defined gain adaptation threshold of the non-linear amplifier-comparator is set according to a deviation between the first reference signal which is a reference voltage, and the second reference signal, which is a peak voltage delivered at the output of a peak detector, which is connected to the output of the input amplifier, if the peak voltage deviates by more than 5 or 10% from the reference voltage, the defined threshold is exceeded for gain adaptation with a steep slope, while for a voltage deviation below the defined threshold, the gain adaptation is performed with a gentle slope.

* * * * *